United States Patent
Yudahira et al.

(10) Patent No.: US 6,639,408 B2
(45) Date of Patent: Oct. 28, 2003

(54) BATTERY VOLTAGE MEASUREMENT DEVICE

(75) Inventors: Hirofumi Yudahira, Shizuoka (JP); Ichiro Maki, Kanagawa (JP); Naohisa Morimoto, Aichi (JP)

(73) Assignees: Matsushita Electric Industrial Co., Ltd., Osaka (JP); Toyota Jidosha Kabushiki Kaisha, Aichi (JP)

(*) Notice: Subject to any disclaimer, the term of this patent is extended or adjusted under 35 U.S.C. 154(b) by 35 days.

(21) Appl. No.: 10/000,060

(22) Filed: Nov. 2, 2001

(65) Prior Publication Data

US 2002/0075004 A1 Jun. 20, 2002

(30) Foreign Application Priority Data

Nov. 2, 2000 (JP) ......................................... 2000-336780

(51) Int. Cl.[7] ........................ G01R 31/36; G01N 27/416
(52) U.S. Cl. ...................................................... 324/434
(58) Field of Search ................................ 324/434, 426, 324/428, 429, 430, 433; 340/636; 702/63; 320/106, 107, 119, 120

(56) References Cited

U.S. PATENT DOCUMENTS 5,808,469 A * 9/1998 Kopera ........................ 324/434
6,362,627 B1 * 3/2002 Shimamoto et al. ........ 324/434

FOREIGN PATENT DOCUMENTS

| JP | 11-113182 | 4/1999 |
| JP | 11-248755 | 9/1999 |
| JP | 11-248756 | 9/1999 |
| JP | 11-248757 | 9/1999 |

* cited by examiner

Primary Examiner—John E. Chapman
Assistant Examiner—James Kerveros
(74) Attorney, Agent, or Firm—Snell & Wilmer, LLP

(57) ABSTRACT

A battery voltage measurement device includes: a plurality of first switching sections, wherein each pair of adjacent first switching sections sequentially selects two output terminals of each of a plurality of battery blocks included in a battery pack; a level change section for changing a level of a battery voltage of each battery block which is input to the level change section via the first switching section; an A/D conversion section for performing an A/D conversion of battery voltage data output from the level change section; and a reference voltage control section for controlling an output of a reference voltage of the level change section according to the polarity of the voltage input to the level change section.

20 Claims, 7 Drawing Sheets

BATTERY VOLTAGE MEASUREMENT DEVICE

BACKGROUND OF THE INVENTION

1. Field of the Invention

The present invention relates to a battery voltage measurement device for measuring a voltage of stacked rechargeable batteries (a battery pack) which is mounted in an apparatus driven by the rechargeable batteries, such as an electric vehicle or the like.

2. Description of the Related Art

As a low-pollution vehicle designed for the purpose of solving environmental problems and energy problems, an electric vehicle such as an HEV (hybrid electric vehicle) and a PEV (pure electric vehicle) has received a great deal of attention up to the present. The electric vehicle has rechargeable batteries mounted therein, and the electric power of the rechargeable batteries drives an electric motor so as to run the electric vehicle. The electric vehicle has a high-voltage circuit for driving the electric motor and a low-voltage circuit for driving various electronic devices such as acoustic equipment, lighting devices, and an electronic controller (e.g., ECU; electronic control unit). The high-voltage circuit includes an inverter for driving an electric motor, and the inverter controls and drives the electric motor.

In a battery control section of such an electric vehicle, in order to obtain an output state of the rechargeable batteries which stably supplies electric power to the electric motor, it is necessary to use a battery voltage measurement device to accurately measure a battery voltage of each battery block of the battery pack.

FIG. 5 is a circuit diagram illustrating an exemplary structure of a conventional battery voltage measurement device 100. In FIG. 5, the battery voltage measurement device 100 includes: a plurality of switches 120 in which each pair of adjacent switches 120 sequentially selects two corresponding output terminals 111a of a battery block 111 included in a battery pack 110; a capacitor 130 for storing (copying) a designated battery voltage; switches 140 for selectively applying the battery voltage stored in the capacitor 130 to a differential amplifier 150; the differential amplifier 150 for differentially amplifying the stored battery voltage which is input thereto via the switches 140; and an A/D converter 160 for performing an A/D conversion of the voltage output from the differential amplifier 150.

The battery pack 110 includes a plurality of serially-connected battery blocks 111. A value of a voltage output from one battery block 111 (battery module) is, for example, about DC 20 V. The maximum value of a voltage output from all of the serially-stacked battery blocks 111 is about DC 400 V.

Each pair of adjacent switches 120 is connected to the two corresponding output terminals 111a of each of the plurality of battery blocks 111.

The capacitor 130 has electrodes connected to a pair of conductor lines 141a and 141b laid between the switches 120 and the switches 140. The capacitor 130 temporarily stores a battery voltage of each of the battery blocks 111, which is transferred via two designated switches 120 to the capacitor 130.

Each of the switches 140 is connected to one of the two input terminals of the differential amplifier 150 and serves to connect the differential amplifier 150 to the capacitor 130 or disconnect the differential amplifier 150 from the capacitor 130. On/Off control of the plurality of switches 120 and the switches 140 is performed by a switching controller (not shown), e.g., a microcomputer.

With the above-described structure, at first, in order to store (copy) a battery voltage of a first battery block 111 in (into) the capacitor 130, each of the switches 120 connected to one of the two output terminals 111a of the first battery block 111 is turned on. At this time, the switches 140 are turned off to disconnect the capacitor 130 from both of the two input terminals of the differential amplifier 150.

Next, all the switches 120 are turned off to disconnect the capacitor 130 from all of the battery blocks 111, and then the switches 140 are turned on so as to input the battery voltage of the first battery block 111, which is stored in the capacitor 130, to the differential amplifier 150 for a gain adjustment. The battery voltage, e.g., DC 20 V, is differentially amplified by the differential amplifier 150 so as to be DC 5 V, which is in an input voltage range (dynamic range) of the A/D converter 160. The A/D converter 160 performs an A/D conversion of battery voltage data corresponding to the differentially-amplified battery voltage. The A/D-converted battery voltage data can be read by, for example, a microcomputer (not shown) in a subsequent stage.

In a similar manner, a battery voltage of the second battery block 111 is stored in (copied into) the capacitor 130. The battery voltage stored in the capacitor 130 which is derived from the second battery block 111 has an inverted polarity to that derived from the first battery block. The battery voltage of the second battery block 111, which is stored in the capacitor 130, is differentially amplified by the differential amplifier 150, and then the A/D converter 160 performs an A/D conversion of the differentially-amplified battery voltage.

Referring to FIGS. 6A, 6B, 7A, 7B, 8A, and 8B, the differential amplifier 150 and the A/D converter 160 are described in more detail below.

In general, when an analog input voltage is arithmetically processed in a CPU (central processing unit), a voltage value conversion circuit and an A/D converter are used.

The voltage value conversion circuit includes an analog circuit for performing division when an input voltage is high and performing multiplication when the input voltage is low (the analog circuit also performs addition and subtraction in addition to division and multiplication). The analog circuit is realized by a voltage divider circuit including a resistance, a circuit using an operational amplifier, and the like. A conversion result produced by the voltage value conversion circuit corresponds to an input voltage range of an A/D converter. The input voltage range of the A/D converter is, for example, between GND (0 V) and DC 5 V.

The A/D converter is a component for comparing an input voltage (e.g., a battery voltage output from the voltage value conversion circuit) with a reference voltage to convert the input voltage into digital data which can be read by a microcomputer. The performance of an A/D converter is generally determined according to the fineness of comparison in view of resolution rather than conversion accuracy although it is important for comparing voltages. The fineness of comparison represents the resolution.

In a brief description of the resolution, as illustrated in FIG. 6A, for example, in the case of a 10-bit A/D converter, an input voltage range from 0 V to 5 V is resolved into 1024 (the tenth power of two) levels of a reference voltage, and an input voltage is compared to the reference voltage to determine at which voltage level the input voltage is. In the case where the number of bits becomes greater, as illustrated in a 12-bit A/D converter of FIG. 6B, the input voltage range from 0 V to 5 V is resolved into 4096 (the twelfth power of two) levels of the reference voltage, and an input voltage is compared to the reference voltage to determine at which voltage level the input voltage is. That is, as the number of bits becomes greater, more detailed measurement of the input voltage can be carried out.

In general, in the case of detecting a potential difference in an input voltage, a differential amplifier includes an operational amplifier as a voltage value conversion circuit. The operational amplifier is used when a reference point of an input voltage A is not determined, for example, in the case of a battery voltage.

For example, when the polarity of an input voltage A1 is noninverting (i.e., always positive or negative), as illustrated in FIG. 7A, a gain (i.e., R2/R1) of a differential amplifier 151a is fixed, and (an input voltage×gain)=(A1×R2/R1)=(an output voltage B1), can be readily obtained by the differential amplifier 151, whereby a suitable output voltage B1 can be always output to an A/D converter in a next stage.

As illustrated in FIGS. 5 and 7B, when the polarity of an input voltage A2 is inverted in the process of sequentially storing the voltage values of the battery blocks 111 in the capacitor 130, by applying an offset voltage (DC 2.5 V) to a reference voltage for the differential amplifier 150, the input voltage range can be half the input voltage range of the A/D converter 160 (FIG. 5). Thus, it is possible to always output an output voltage B2 suitable to the input voltage range of the A/D converter 160 while the gain (i.e., R2/R1) of the differential amplifier 150 is fixed. That is, (an input voltage×gain)+(an offset voltage (DC 2.5 V))=(A2×R2/R1)+$V_{offset}$=(the output voltage B2), can be obtained by the differential amplifier 150.

In other words, as illustrated in FIG. 8A, when the polarity of the input voltage A2 is positive, an input voltage range from DC 2.5 V to the maximum voltage DC 5 V, which is half the input voltage range of the A/D converter 160, is used. When the polarity of the input voltage A2 is negative, an input voltage range from DC 2.5 V to the minimum voltage DC 0 V, which is half the input voltage range of the A/D converter 160, is used. Specifically, even when the A/D converter 160 is, for example, a 12-bit A/D converter, in practice, the A/D converter 160 can only have the input voltage range provided by an 11-bit A/D converter, whose resolution is lower than that of the 12-bit A/D converter.

As described above, in the conventional structure, in the case where the input voltage is voltage A1 of FIG. 8B having noninverting polarity, the entire input voltage range of the A/D converter 160 can be used, but in the case where the input voltage is voltage A2 of FIG. 8A having inverting polarity, only a half of the input voltage range of the A/D converter 160 can be used when the polarity of the input voltage A2 is positive, and the other half of the input voltage range of the A/D converter 160 can be used when the polarity of the input voltage A2 is negative, so that only half the full resolution of the A/D converter 160 is utilized.

SUMMARY OF THE INVENTION

According to one aspect of the present invention, a battery voltage measurement device includes: a plurality of first switching sections, in which each pair of adjacent first switching sections sequentially selects two output terminals of each of a plurality of battery blocks included in a battery pack; a level change section for changing a level of a battery voltage of each battery block which is input to the level change section via the first switching section; an A/D conversion section for performing an A/D conversion of battery voltage data output from the level change section; and a reference voltage control section for controlling an output of a reference voltage of the level change section according to the polarity of the voltage input to the level change section.

With the above-described structure, a reference voltage control section controls an output of a reference voltage for a level change section according to inverted polarity of a voltage input to the level change section, so that each time the polarity of a voltage is inverted, the input voltage from the level change section to an A/D converter can be in an input voltage range of the A/D converter. Thus, it is not necessary to restrictedly use only half the input voltage range of the A/D converter assigned to each of the opposite polarities as in a conventionally required manner, and the entire input voltage range of the A/D converter can be used, so that twice the resolution of a conventional A/D converter can be obtained, and the original resolution of the A/D converter can be entirely used.

According to one embodiment of the invention, the battery voltage measurement device may further include: a capacitance section for selectively storing a battery voltage of each of the battery blocks via the first switching section; and a second switching section for selectively applying the battery voltage stored in the capacitance section to the level change section, in which the level change section changes a level of the battery voltage stored in the capacitance section which is input to the level change section via the second switching section.

With the above described structure, when a battery voltage of each of battery blocks is stored in a capacitance section and then the battery voltage stored in the capacitance section is input to the level change section, each time the polarity of a voltage is inverted, the voltage input from the level change section to the A/D converter is caused to be in the input voltage range of the A/D converter, so that twice the resolution of a conventional A/D converter can be obtained, and an effect of the present invention such that the original resolution of the A/D converter can be entirely used can be attained.

According to another embodiment of the invention, the reference voltage control section may include: a third switching section for switching a reference voltage of the level change section; and a first switching control section for controlling the third switching section according to the polarity of the voltage input to the level change section. Alternatively, the reference voltage control section may include: a reference voltage generation section for generating a reference voltage for the level change section; and a reference voltage generation control section for controlling an output of the reference voltage generation section according to the polarity of the voltage input to the level change section.

With the above-described structure, in order to switch a reference voltage for the level change section so as to obtain twice the resolution of the A/D converter, switching of the third switch section is controlled according to the polarity of the voltage input to the level change section or an output of the reference voltage generation section is controlled according to the polarity of the voltage input to the level change section, whereby a required structure can be simple.

According to still another embodiment of the invention, the control performed in accordance with the polarity of the voltage input to the level change section may be performed based on prestored table information for switching control.

With the above-described structure, when the polarity of the voltage input to the level change section is previously known based on prestored table information for the switching control, the reference voltage control section controls the third switching section or the reference voltage generation section based on the table information for switching control, whereby the output of the reference voltage for the level change section can be readily controlled.

According to still another embodiment of the invention, when one preset reference voltage value is selected, if an A/D conversion output of the A/D conversion section represents a maximum value or a minimum value within an input voltage range of the A/D conversion section, the control performed in accordance with the polarity of the voltage input to the level change section may be performed so as to switch the one preset reference voltage value to the other preset reference voltage value.

With the above-described structure, in the case where the polarity of the voltage input to the level change section is previously unknown, when one reference voltage value is selected, if the reference voltage control section determines that an A/D conversion output of the A/D conversion section represents the maximum value or minimum value within the input voltage range of the A/D conversion section, the third switching section or the reference voltage generation section is controlled so as to switch the selected reference voltage value to the other reference voltage value, so that the reference voltage for the level change section can be readily controlled to be output in accordance with the polarity of the voltage input to the level change section.

According to still another embodiment of the invention, the battery voltage measurement device may further include: a fourth switching section for changing a feedback resistance value of the level change section so as to change a gain; and a second switching control section for controlling the fourth switching section according to the polarity of the voltage input to the level change section.

With the above-described structure, not only by causing the input voltage from the level change section to the A/D conversion section to be in the input voltage range of the A/D conversion section, but also by changing a gain of the level change section, the resolution of the A/D conversion section can be finer.

According to another aspect of the present invention, a battery voltage measurement device includes: a battery pack including a plurality of battery blocks; a plurality of first switching sections, in which each pair of adjacent first switching sections sequentially selects two output terminals of each of the plurality of battery blocks; a level change section for changing a level of a battery voltage of each battery block which is input to the level change section via the first switching section; an A/D conversion section for performing an A/D conversion of battery voltage data output from the level change section; and a reference voltage control section for controlling an output of a reference voltage of the level change section according to the polarity of the voltage input to the level change section.

According to one embodiment of the invention, the battery voltage measurement device may further include: a capacitance section for selectively storing a battery voltage of each of the battery blocks via the first switching section; and a second switching section for selectively applying the battery voltage stored in the capacitance section to the level change section, in which the level change section changes a level of the battery voltage stored in the capacitance section which is input to the level change section via the second switching section.

According to another embodiment of the invention, the reference voltage control section may include: a third switching section for switching a reference voltage of the level change section; and a first switching control section for controlling the third switching section according to the polarity of the voltage input to the level change section.

According to still another embodiment of the invention, the reference voltage control section may include: a reference voltage generation section for generating a reference voltage for the level change section; and a reference voltage generation control section for controlling an output of the reference voltage generation section according to the polarity of the voltage input to the level change section.

According to still another embodiment of the invention, the battery voltage measurement device may further include: a fourth switching section for changing a feedback resistance value of the level change section so as to change a gain; and a second switching control section for controlling the fourth switching section according to the polarity of the voltage input to the level change section.

According to still another embodiment of the invention, the reference voltage control section may include: a third switching section for switching a reference voltage of the level change section; and a first switching control section for controlling the third switching section according to the polarity of the voltage input to the level change section.

According to still another embodiment of the invention, the control performed in accordance with the polarity of the voltage input to the level change section may be performed based on prestored table information for switching control.

According to still another embodiment of the invention, when one preset reference voltage value is selected, if an A/D conversion output of the A/D conversion section represents a maximum value or a minimum value within an input voltage range of the A/D conversion section, the control performed in accordance with the polarity of the voltage input to the level change section may be performed so as to switch the one preset reference voltage value to the other preset reference voltage value.

Thus, the invention described herein makes possible the advantages of providing a battery voltage measurement device which can improve resolution using an entire input voltage range of an A/D converter even when the polarity of a voltage input to a differential amplifier is inverting.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of a battery voltage measurement device according to the present invention which is applied to an electric circuit for driving an electric vehicle will be described, and thereafter, a voltage measurement section which is a feature of the present invention will be described in detail.

EXAMPLE 1

Figure 1:
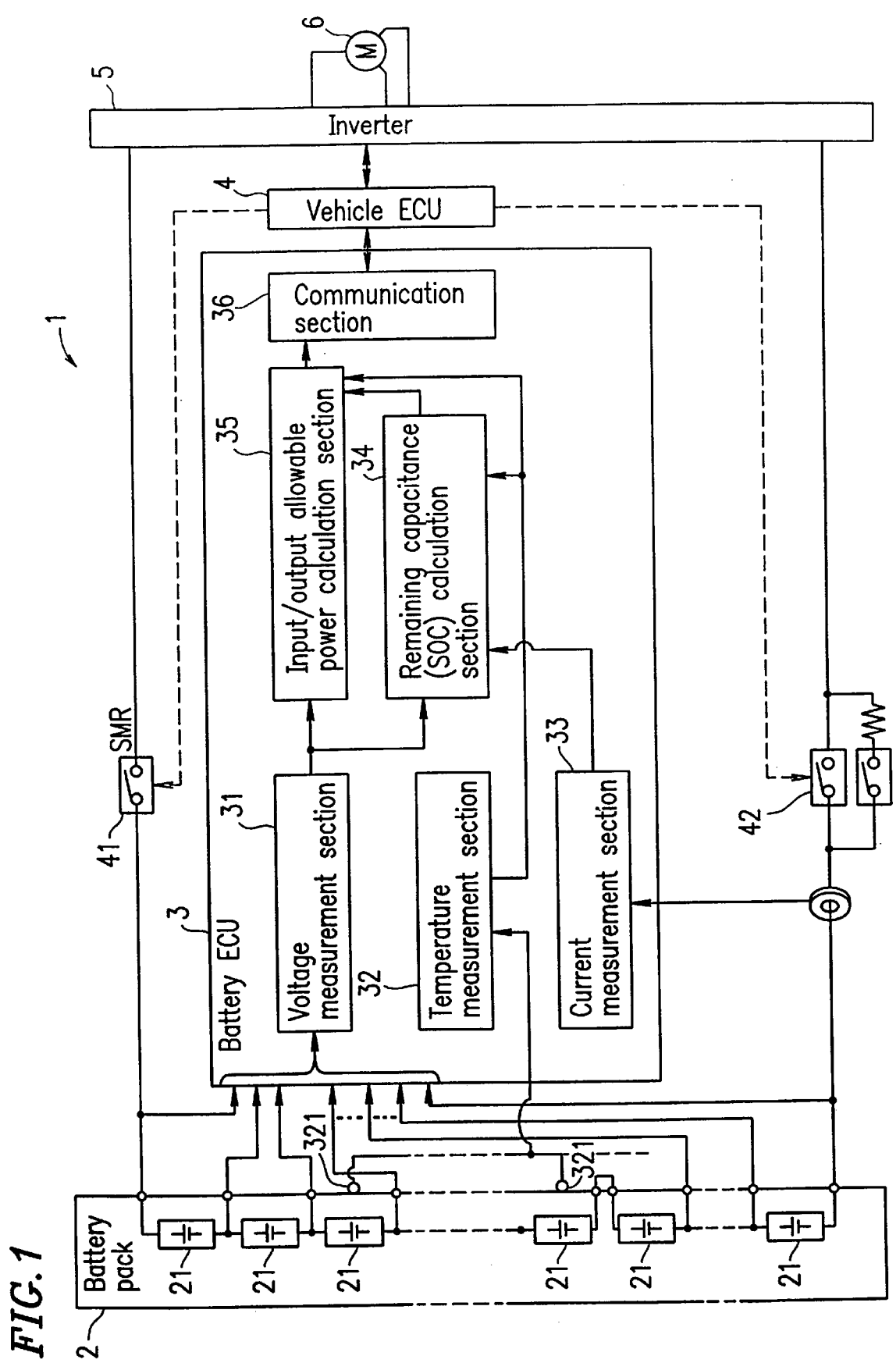
FIG. 1 is a schematic block diagram illustrating a structure of an electric circuit for driving an electric vehicle according to Example 1 of the present invention.

FIG. 1 is a schematic block diagram illustrating a structure of an electric circuit 1 for driving an electric vehicle according to Example 1 of the present invention. In FIG. 1, the electric circuit 1 for driving an electric vehicle includes: a battery pack 2 as a power supply source; a battery ECU (battery electronic control unit) 3 for controlling an output of the battery pack 2 by obtaining a particular state of the battery pack 2 (e.g., a battery remaining capacitance; SOC); a vehicle ECU (vehicle electronic control unit) 4 for controlling components of the electric vehicle; an inverter 5 for converting a battery voltage from the battery pack 2 into a prescribed three-phase high voltage; and an electric motor 6 for rotating an axle of the electric vehicle (not shown), for example, by a three-phase high voltage power from the inverter 5.

The battery pack 2 (which is also called a "primary battery" or "main battery") includes a plurality (of serially-connected battery blocks 21 (each of the battery blocks 21 includes a plurality of battery cells). A value of a voltage output from each of the battery blocks 21 is, for example, DC 20 V. The maximum value of a voltage output from all of the battery blocks 21 is about DC 400 V.

The battery ECU 3 includes a voltage measurement section 31, a temperature measurement section 32, a current measurement section 33, a remaining capacitance (SOC) calculation (or detection) section 34, an input/output allowable power calculation section 35, and a communication section 36.

The voltage measurement section 31 measures a battery voltage of each of the battery blocks 21 of the battery pack 2.

The battery pack 2 includes a plurality of temperature sensors 321 provided in suitable places for reliable temperature sensing. The temperature measurement section 32 measures, based on a sensor output from the temperature sensor 321, a battery temperature at each place where the temperature sensors 321 are located, which varies due to heat generated by the battery pack 2.

The current measurement section 33 detects a battery current flowing through a closed circuit between the battery pack 2 and the inverter 5 in a magnetic compensation manner (or in a shunt resistance manner).

The remaining capacitance detection section 34 detects a remaining capacitance SOC of each of the battery blocks 21 based on a measurement battery voltage value measured for each battery block 21, a measurement current value measured by the current measurement section 33, and a measurement battery temperature value measured by the temperature measurement section 32.

The input/output allowable power calculation section 35 receives data representing the measurement battery voltage value measured for each battery block 21, the measurement battery temperature value, and a value of the remaining capacitance SOC. The input/output allowable power calculation section 35 calculates, for example, an output allowable power representing how much electric power a vehicle can output at present or an input allowable power representing how much electric power is regenerated in a vehicle at present.

The communication section 36 transmits the input/output allowable power information to the vehicle ECU 4.

The vehicle ECU 4 detects, for example, an ignition key IG being turned on and turns on switches 41 and 42, so that the battery power from the battery pack 2 is input to the inverter 5. For example, when a measurement battery temperature is extremely high, the vehicle ECU 4 suppresses an output from the inverter 5, according to an input/output allowable power value output from the input/output allowable calculation section 35, until the battery temperature falls to a prescribed battery temperature (e.g., 60° C. or lower).

The voltage measurement section 31 which is a feature of the present invention will be described in detail below.

Figure 2:
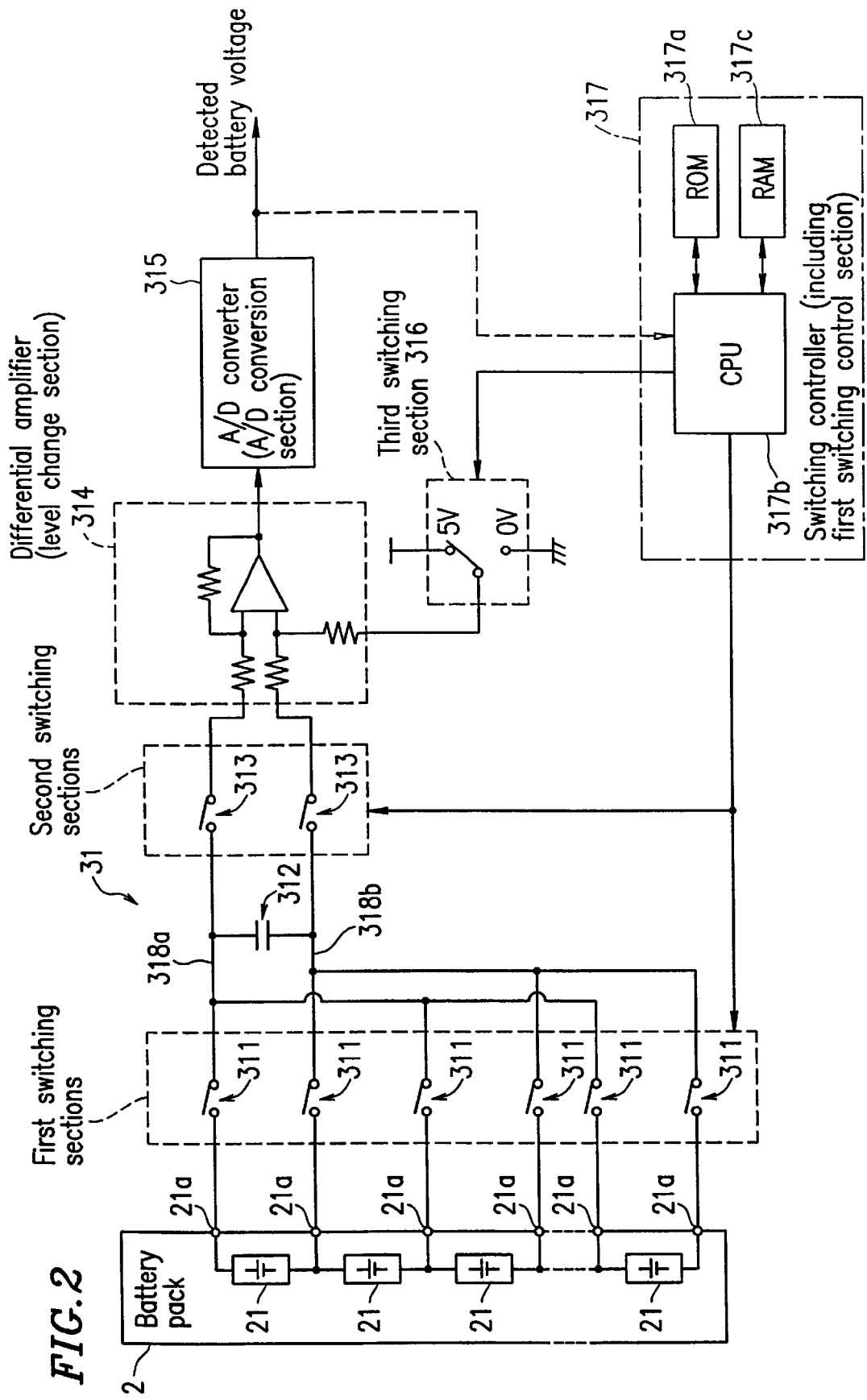
FIG. 2 is a circuit diagram illustrating an exemplary structure of a battery pack and a voltage measurement section of FIG. 1.

FIG. 2 is a circuit diagram illustrating an exemplary structure of the battery pack 2 and the voltage measurement section 31 of FIG. 1. In FIG. 2, the voltage measurement section 31, which is a component of a battery voltage measurement device, includes: a plurality of switches 311 (first switching sections) in which each pair of adjacent switches 311 selects two output terminals 21a of each of the battery blocks 21 included in the battery pack 2; a capacitor 312 (capacitance section) for selectively storing a battery voltage of each of the battery blocks 21; and switches 313 (second switching sections) for selectively applying the battery voltage stored in the capacitor 312 to the differential amplifier 314.

The voltage measurement section 31 further includes: the differential amplifier 314 (differential amplifier section and/or a gain adjustment section (level change section)); an A/D converter 315 (A/D conversion section) for performing an A/D conversion of an output from the differential amplifier 314; a switch 316 (third switching section) for switching a reference power source of the differential amplifier 314; and a switching controller 317 (reference voltage control section or first switching control section) for controlling the switch 316 according to the polarity of a voltage input to the differential amplifier 314 to control an output from reference power sources of the differential amplifier 314.

Each of the plurality of switches 311 is connected to one of the output terminals 21a of the plurality of battery blocks 21 at one end and is connected to either of a pair of conductor lines 318a and 318b at the other end.

The capacitor 312 temporarily stores a battery voltage applied via two designated switches 311 from two output terminals 21a of each of the battery blocks 21.

Each of two output terminals (output side) of the switches 313 is connected to one of two input terminals of the differential amplifier 314 and used for connection or disconnection between the two input terminals of the differential amplifier 314 and two electrodes of the capacitor 312.

The differential amplifier 314 differentially amplifies the battery voltage (e.g., DC 20 V) of the capacitor 312, which is input to the differential amplifier 314 via the switches 313, so that a value of the battery voltage is in an input voltage range of the A/D converter 315, e.g., DC 5 V.

The A/D converter 315 performs an A/D conversion of a voltage output from the differential amplifier 314 according to the input voltage range (from 0 V to DC 5 V) of the A/D converter 315.

In the switch 316, there are two prescribed offset voltages (reference voltages DC 5 V or 0 V) output from the reference power sources to the differential amplifier 314. The switch 316 switches between offset voltage sources (DC 5 V or 0 V) so that either of the offset voltage sources is connected to one input terminal of the differential amplifier 314.

The switching controller 317 is a microcomputer and includes a ROM 317a for storing a voltage measurement control program for measuring a voltage of each of the battery blocks 21 and a variety of data related to the control program, a CPU 317b (central processing unit) for executing voltage measurement control processing based on the control program, and a RAM 317c for storing data required for the CPU 317b to execute a variety of operations.

As data related to a switching control program included in the voltage measurement control program, for example, control table information including on/off control contents for the switches 311, 313, and 316 is prestored in the ROM 317a. The switching controller 317 performs the on/off control of the switches 311 and 313 and controls the switch 316 according to the control table. In the control table, whether a voltage input to the differential amplifier 314 is positive or negative and which battery block 21 is selected are decided by the on/off control of the plurality of the switches 311, and thus, an operation of the switch 316 is set so as to select either of the reference power sources 0 V or DC 5 V based on the polarity (positive or negative) of the input voltage.

When the switching controller 317 controls the switch 316, the switching controller 317 controls timing of the entire operation of the voltage measurement section 31, and thus the polarity of a voltage input to the differential amplifier 314 can be determined in advance using the switching controller 317. Accordingly, the switching controller 317 controls the switch 316 based on the control table so as to apply a reference power source voltage (0 V or DC 5 V) selected according to the polarity of the input voltage to one of the input terminals of the differential amplifier 314.

With the structure described above, an operation of the voltage measurement section 31 is described below. Referring to FIG. 1, the ignition switch IG (not shown) is turned on so as to drive the vehicle ECU 4, and the switches 41 and 42 connected to output terminals at both ends of the battery pack 2 are turned on, so that electric power from the battery pack 2 is supplied to the inverter 5. The inverter 5 converts the electric power from the battery pack 2 into a three-phase high voltage and supplies it to the electric motor 6. The electric motor 6 rotates an axle of the vehicle so as to run the vehicle.

Referring to FIG. 2, when an output battery voltage of each of the battery blocks 21 is measured, in order to store a battery voltage of a first battery block 21 in the capacitor 312, the switching controller 317 turns on, based on the control table, each of two of the switches 311 connected to one of two corresponding output terminals 21a of the first battery block 21 (while the other switches 311 remain off). In the meantime, the switches 313 are turned off to disconnect electrodes of the capacitor 312 from input terminals of the differential amplifier 314.

All of the switches 311 are turned off to disconnect the capacitor 312 from all of the battery blocks 21, and then the switches 313 are turned on to input the battery voltage of the first battery block 21 (e.g., DC 20 V), which is stored in the capacitor 312, to the differential amplifier 314. At this time, the switching controller 317 controls the switch 316 based on the control table so as to select the 0 V reference voltage. As a result, the differential amplifier 314 outputs a voltage such that the entire input voltage range (from 0 V to DC 5 V) of the A/D converter 315 can be used.

An A/D conversion of the battery voltage (detection of the battery voltage) differentially amplified (for a gain adjustment or a voltage adjustment) by the differential amplifier 314 is performed by the A/D converter 315 with its original resolution. Data (digital data) corresponding to the detected battery voltage output from the A/D converter 315 is read by a microcomputer (not shown) in a subsequent stage.

Next, in order to store a battery voltage of the second battery block 21 in the capacitor 312, the switching controller 317 turns on, based on the control table, each of two switches 311 connected to one of two output terminals 21a of the second battery block 21 (while the other switches 311 remain off). At this time, the battery voltage stored in the capacitor 312 has an inverted polarity to that derived from the first battery block 21.

The switching controller 317 turns off, based on the control table, all the switches 311 to disconnect the capacitor 312 from all the battery blocks 21, and turns on the switches 313 to input the battery voltage of the second battery block 21 (e.g., DC 20 V), which is stored in the capacitor 312, to the differential amplifier 314. In the meantime, the switching controller 317 controls the switch 316 based on the control table so as to select the DC 5 V reference voltage. As a result, the differential amplifier 314 outputs a voltage such that the entire input voltage range (DC 5 V to 0 V) of the A/D converter 315 can be used.

An A/D conversion of the battery voltage (detection of the battery voltage) differentially amplified (for a gain adjustment or a voltage adjustment) by the differential amplifier 314 is performed by the A/D converter 315 with its original resolution. Data (digital data) corresponding to the detected battery voltage output from the A/D converter 315 is read by a microcomputer (not shown) in a subsequent stage.

As described above, according to Example 1 of the present invention, the switching controller 317 controls, based on the control table set in accordance with the polarity of a voltage input to the differential amplifier 314, the switch 316 between the reference voltages (0 V and DC 5 V) output from the reference power source to the differential amplifier 314. Each time the polarity of a voltage is inverted, the switching controller 317 can cause an input voltage from the differential amplifier 314 to the A/D converter 315 to be in the input voltage range of the A/D converter 315. Thus, it is not necessary to restrictedly use only half the input voltage range of the A/D converter 315 assigned to each of the opposite polarities as in a conventionally required manner. Therefore, according to the present invention, the entire input voltage range of the A/D converter 315 can be used, so that twice the resolution of a conventional A/D converter can be obtained, and the original resolution of the A/D converter 315 can be entirely used.

EXAMPLE 2

In Example 1 of the present invention, in order to use an entire dynamic range (input voltage range) of the A/D converter 315, the switch 316 switches the reference voltages for the differential amplifier 314 based on the control table set in accordance with inverting polarity (positive or negative) of a voltage input to the differential amplifier 314. In Example 2 of the present invention, the reference voltage for the differential amplifier 314 is generated as an output voltage (offset voltage) of the D/A converter 316A based on the control table set in accordance with the inverting polarity of the input voltage.

Figure 3:
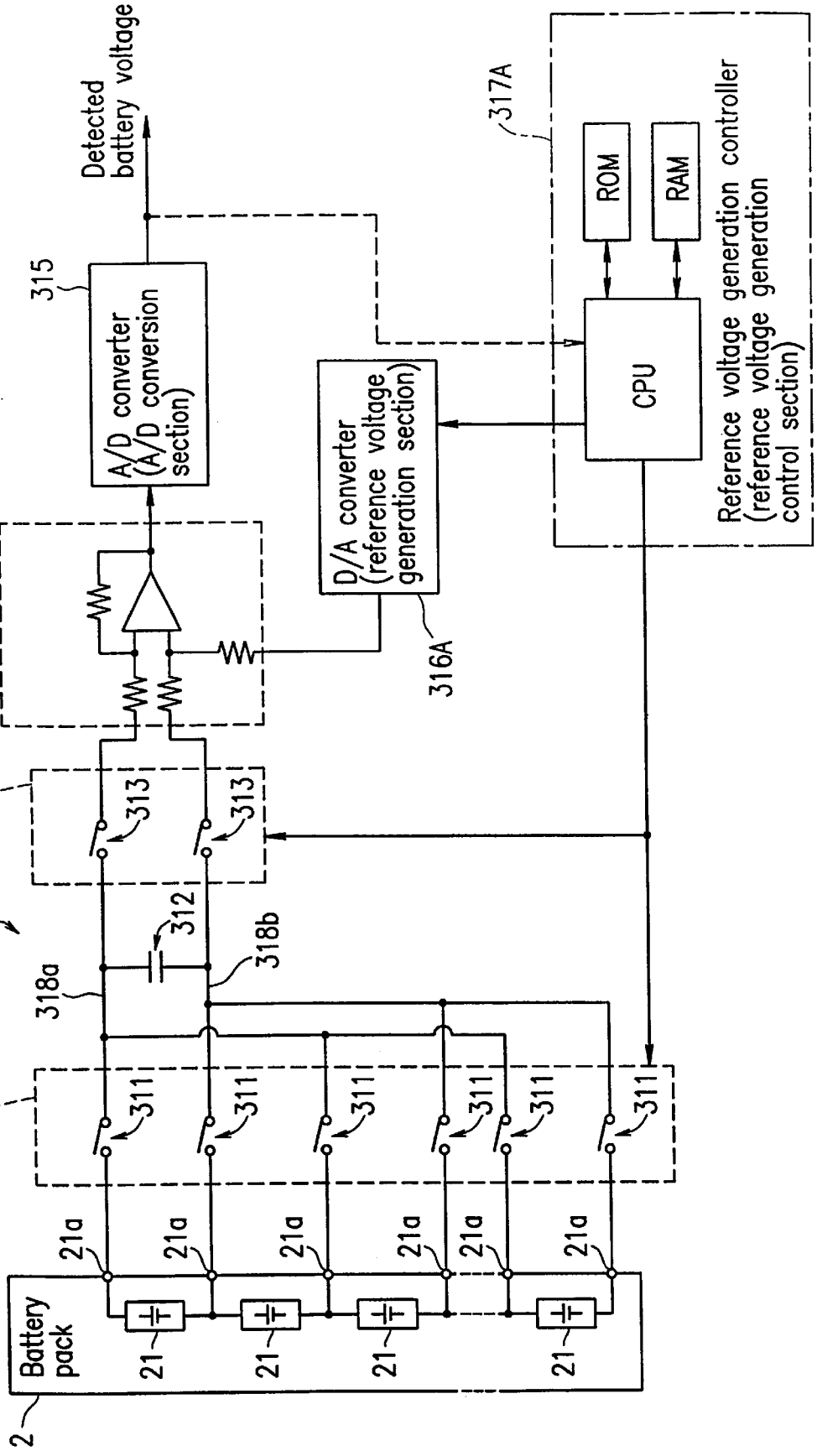
FIG. 3 is a circuit diagram illustrating an exemplary structure of a voltage measurement section according to Example 2 of the present invention.

FIG. 3 is a circuit diagram illustrating an example of a structure of a voltage measurement section according to Example 2 of the present invention. In FIG. 3, components achieving similar effects to those achieved by the components of FIGS. 1 and 2 will be denoted by the same reference numerals, and thus description thereof will be omitted.

In FIG. 3, a voltage measurement section 31A, which is a component of a battery voltage measurement device, includes a D/A converter 316A (reference voltage generation section) for changing a reference voltage for the differential amplifier 314, and a reference voltage generation controller 317A (reference voltage generation control section) for controlling the reference voltage output from the D/A converter 316A based on the control table.

The D/A converter 316A is free to output a desired reference voltage according to control data from the reference voltage generation controller 317A. The D/A converter 316A is a component which may be included in a CPU or may be an IC.

The reference voltage generation controller 317A outputs the control data to the D/A converter 316A based on the control table including switching control output contents which correspond to on/off data of the switches 311 and 313. In this case, the polarity of a voltage input to the differential amplifier 314 is determined by the on/off data of the switches 311 and 313.

With the above-described structure, according to Example 2 of the present invention, the D/A converter 316A is free to output two different fixed reference voltage values, and thus the D/A converter 316A can perform as well as the switch 316 having the voltage sources (DC 5 V and 0 V) of Example 1 of the present invention and can cause the A/D converter 315 to have twice the conventionally-used resolution.

In Examples 1 and 2 of the present invention, the switching controller 317 and the reference voltage generation controller 317A have been described with reference to the case where the polarity of the voltage input to the differential amplifier 314 is previously known and the timing of the entire operation of the voltage measurement section 31 is controlled. However, the present invention is not limited to such a case, and even in the case where the polarity of the voltage input to the differential amplifier 314 is previously unknown, it is possible to deal with such a case as long as any of preset reference voltage values is selected. If a probability that one preset reference voltage value is correct is one in two, a correct output value can be obtained. In the case where the value of the input voltage does not correspond to the preset reference voltage value, when a battery voltage detected from the A/D converter 315 is input to the switching controller 317 as represented by the dashed-line in FIG. 2 (or the reference voltage generation controller 317A of FIG. 3) and a CPU (a microcomputer) of the switching controller 317 (or the reference voltage generation controller 317A) reads a value of the detected battery voltage, the value of the detected battery voltage does not correspond to the original input voltage range (from 0 V to DC 5 V) of the A/D converter 315. However, the CPU (microcomputer) determines that the input voltage has a maximum or minimum value in the input voltage range. The "maximum value" or "minimum value" described herein includes values of battery voltages which are greater than the maximum voltage in the input voltage range or smaller than the minimum voltage in the input voltage range, respectively. Immediately after the switching controller 317 (or the reference voltage generation controller 317A) measures the maximum or minimum value, the other reference voltage (the other preset reference voltage value) may be selected so as to produce a correct detection result for the same input voltage. Alternatively, even if a correct value is measured using the previously-selected preset reference voltage, it is possible to confirm that the battery voltage value measured, using the previously-selected preset reference voltage value, is correct by measuring the same input voltage using the other preset reference voltage value to obtain the maximum or minimum value.

As described above, in the case where one reference voltage value is set, when an A/D-converted output (a detected battery voltage) of the A/D converter 315 represents the maximum or minimum voltage value within the input voltage range of the A/D converter 315, the switching controller 317 (or the reference voltage generation controller 317A) controls the switch 316 (or the D/A converter 316A) so that the other reference voltage value is selected according to the polarity of the voltage input to the differential amplifier 314. As a result, even if the polarity of a voltage input to the differential amplifier 314 is previously unknown, it is possible to readily control an output of the reference voltage for the differential amplifier 314 according to the polarity of the input voltage of the differential amplifier 314 by controlling the switch 316 (or the D/A converter 316A).

EXAMPLE 3

Examples 1 and 2 describe the case where the A/D converter 315 obtains twice the conventionally-used resolution. In Example 3 of the present invention, the resolution of the A/D converter 315 is increased twice or more (several times).

Figure 4:
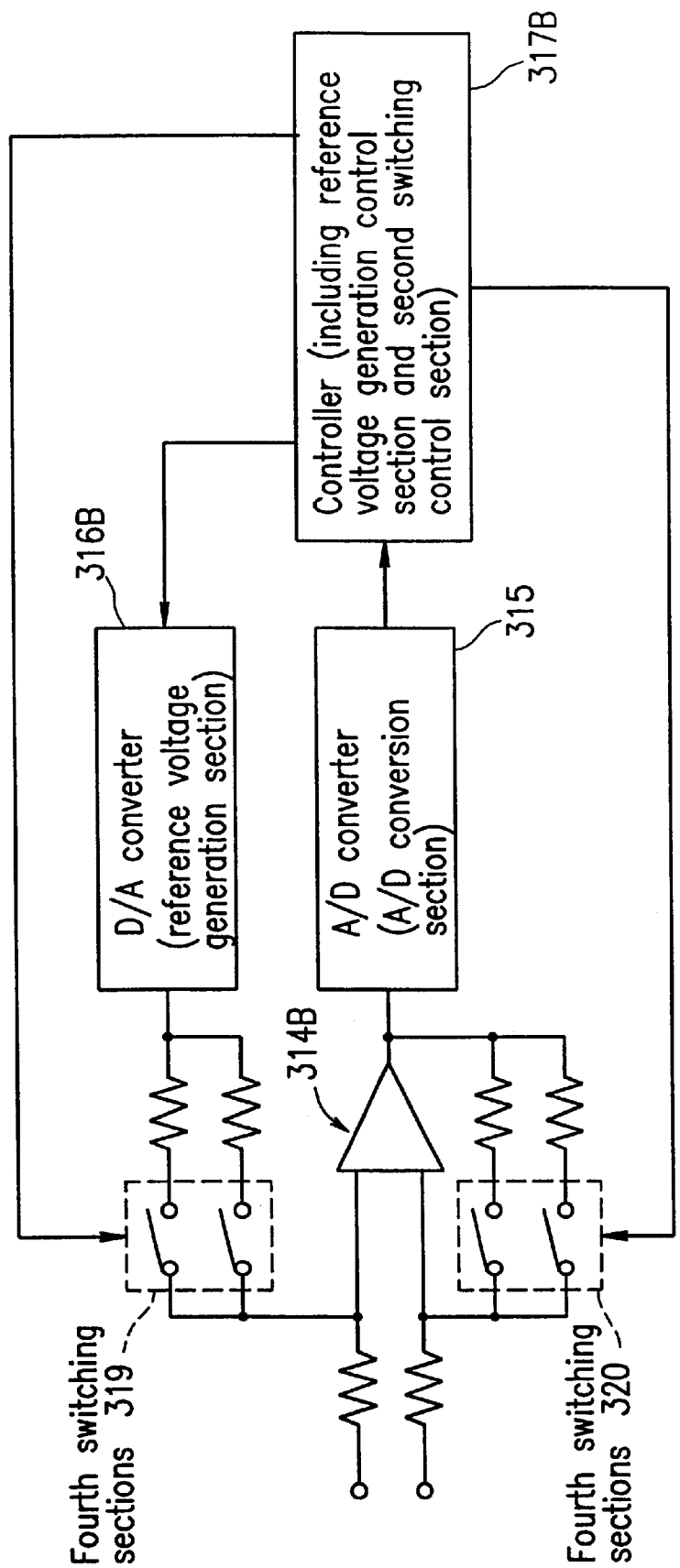
FIG. 4 is a circuit diagram illustrating an exemplary structure of a voltage measurement section according to Example 3 of the present invention.
Figure 5:
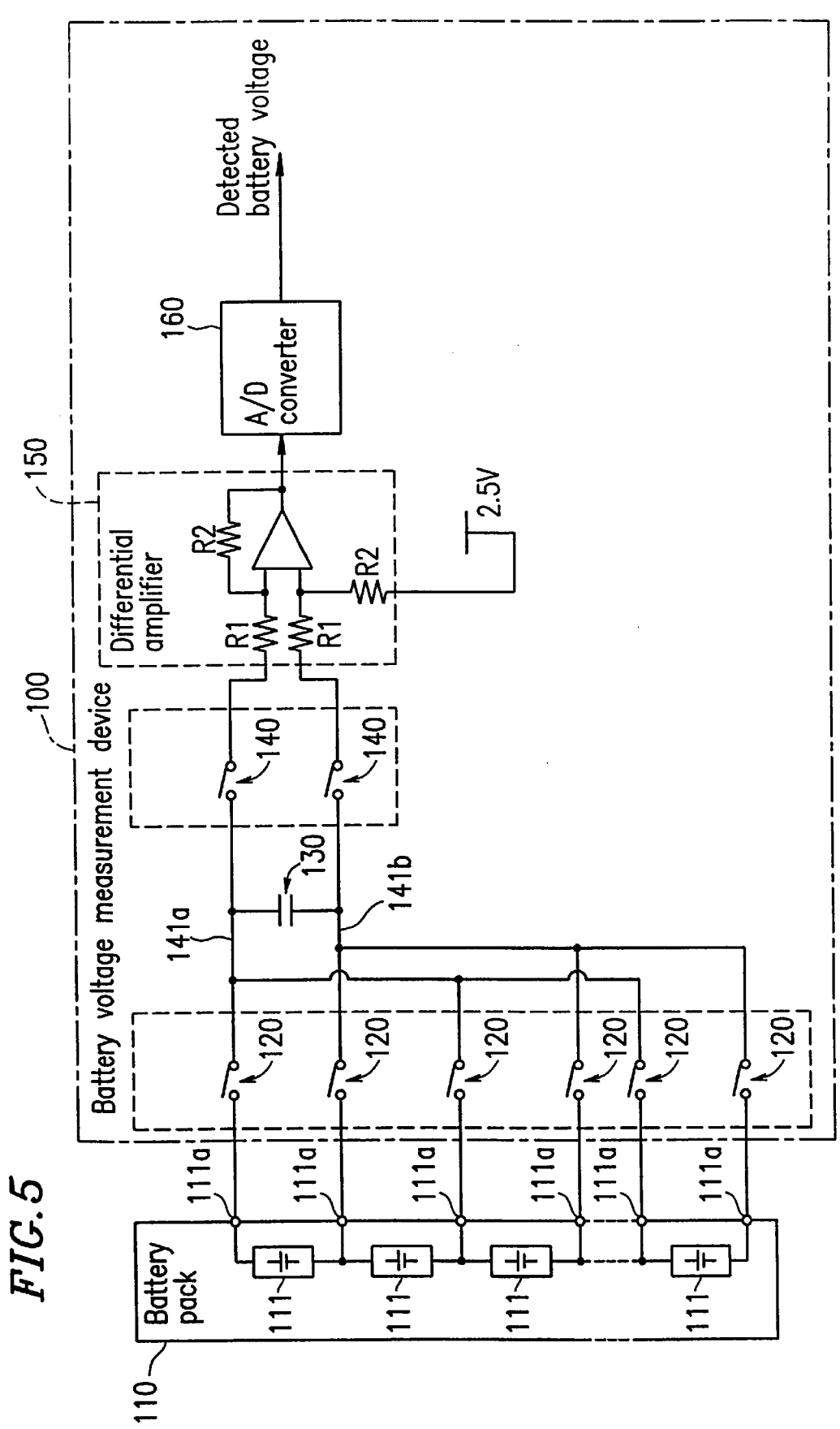
FIG. 5 is a circuit diagram illustrating an exemplary structure of a conventional battery voltage measurement device.
Figure 6A:
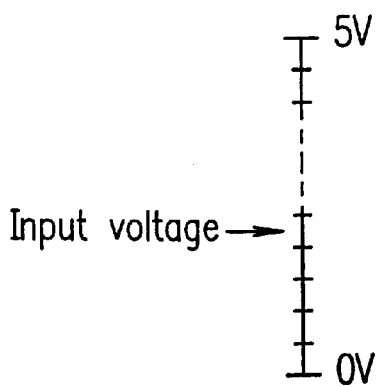
FIG. 6A illustrates detailed levels of an input range of a 10-bit A/D converter.
Figure 6B:
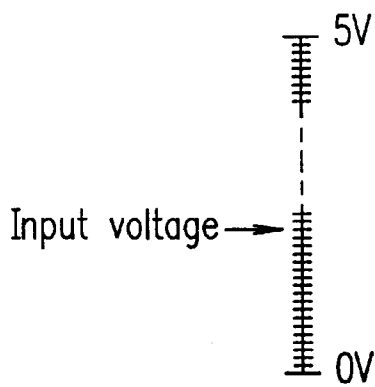
FIG. 6B illustrates detailed levels of an input range of a 12-bit A/D converter.
Figure 7A:
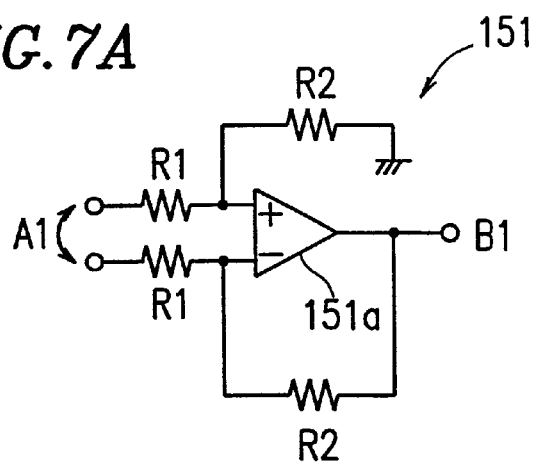
FIG. 7A is a circuit diagram illustrating an example of a differential amplifier in the case where a voltage input thereto is noninverting.
Figure 7B:
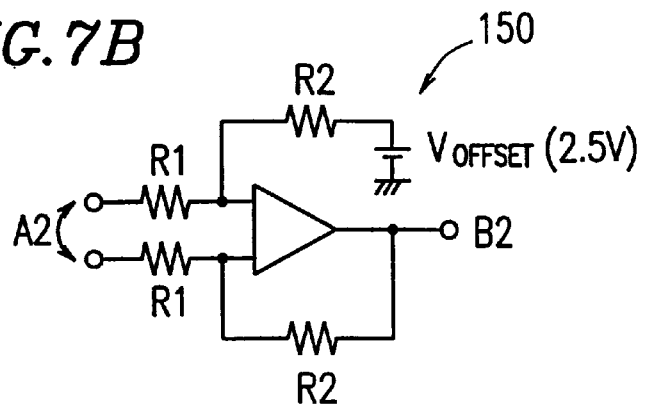
FIG. 7B is a circuit diagram illustrating an example of a differential amplifier in the case where a voltage input thereto is inverting.
Figure 8A:
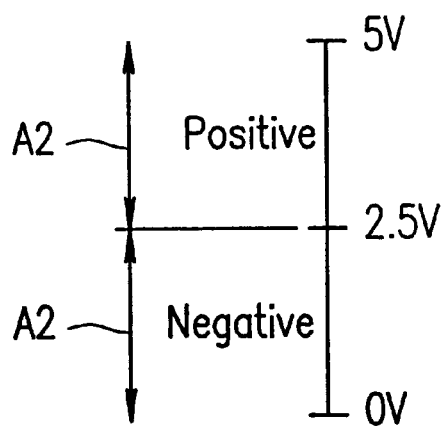
FIG. 8A is a diagram illustrating an example of an input range of an A/D converter in which a voltage input to a differential amplifier is inverting.
Figure 8B:
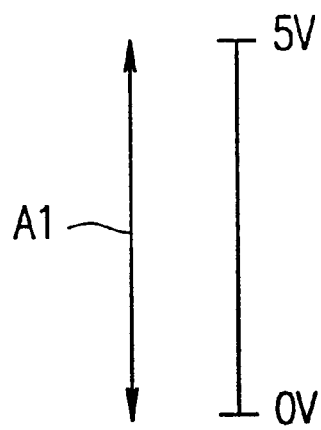
FIG. 8B is a diagram illustrating an example of an input range of an A/D converter in which a voltage input to a differential amplifier is noninverting.

FIG. 4 is a circuit diagram illustrating an exemplary structure of a voltage measurement section according to Example 3 of the present invention. In FIG. 4, in a similar manner to Example 2, a controller 317B detects a battery voltage using twice the conventionally-used resolution of the A/D converter 315. The controller 317B also functions as a reference voltage generation controller for the same input voltage and as a second switching control section for controlling the switches 319 and 320 (fourth switching section) to change a feedback resistance value of a differential amplifier 314B. The reference voltage generation controller controls an output of a reference voltage from the D/A converter 316B (reference voltage generation sections) according to the polarity of a voltage input to the differential amplifier 314B. The second switching control section controls the switches 319 and 320, which are the fourth switching sections serially connected to resistors which determine gain G, according to the polarity of a voltage input to the differential amplifier 314B.

In other words, at the second battery voltage measurement, the controller 317B changes the gain G and an output voltage value of the D/A converter 316B using the switches 319 and 320, so that an offset voltage value is changed, thereby controlling an output voltage value of the differential amplifier 314B so as to be in the input voltage range (from 0 V to DC 5 V) of the A/D converter 315. As a result, the conventionally-used resolution of the A/D converter 315 can be increased twice or more (several times).

With the above-described structure, at first, a battery voltage, e.g., DC 20 V, is measured using the original resolution of the A/D converter 315. Next, in order to measure the battery voltage (DC 20 V) in more detail, resistance values used to obtain the gain G of the differential amplifier 314B are controlled by switching the switches 319 and 320 so as to obtain, for example, twice the gain G. However, for example, when a value of an input voltage is DC 4 V, the above-described operation only causes a voltage DC 8 V to be input to the A/D converter 315. In such a case, when an output voltage value of the D/A converter 316B is changed so as to set an offset voltage value at DC −5 V, the input voltage range of the A/D converter 315 is given as (DC 8 V−DC 5 V)=DC 3 V, so that the input voltage value does not exceed the input voltage range of the A/D converter 315 and the battery voltage can be measured as a voltage value corresponding to DC 3 V. Moreover, by increasing the gain G twice, the original resolution of the A/D converter 315 can be increased twice, which is equivalent to four times (several times as mentioned above) the conventionally-used resolution.

With the above-described method, a voltage input from the differential amplifier 314B to the A/D converter 315 is caused to be in the input voltage range of the A/D converter 315. Moreover, by changing the gain G of the differential amplifier 314B, a battery voltage can be measured using more detailed resolution of the A/D converter 315, i.e., several times the conventionally-used resolution. Thus, a battery voltage measurement performance can be greatly improved. Alternatively, the battery voltage can be measured using a lower-priced general-purpose A/D converter with resolution which is finer than the full resolution of the A/D converter 315, and thus reductions in cost, a mounting area, expenses required for a reliability evaluation, etc., are expected. Accordingly, it is highly advantageous that the general-purpose A/D converter can be used, since high-speed measurement of a battery voltage, a battery current, a battery temperature, etc., is required to be performed with high accuracy and high resolution not only for an electric car, but also for any equipment using a nickel metal hydride battery, a lithium-ion rechargeable battery, etc., in which a state of a capacity is required to be obtained accurately for controlling an operation of such equipment.

Examples 1–3 have described the case where the battery voltage measurement device of the present invention is applied to an electric vehicle. However, the present invention is not limited to such a case, the battery voltage measurement device of the present invention can be applied to any equipment as long as the equipment is driven using electric power of the battery pack 2 including a plurality of battery blocks 21. In such a case, similar effects to those of Examples 1–3 can be attained.

Examples 1–3 have also described the case where a level of a battery voltage is changed using a differential amplifier (a differential amplifier section) which uses an operational amplifier. However, the present invention is not limited to such a case, and a level of the battery voltage can be changed using a voltage divider circuit including a resistance and similar effects to those of Examples 1–3 can be attained.

As described above, according to the present invention, a reference voltage control section controls an output of a reference voltage for a level change section according to inverted polarity of a voltage input to the level change section, so that each time the polarity of a voltage is inverted, the input voltage from the level change section to an A/D converter can be in an input voltage range of the A/D converter. Thus, it is not necessary to restrictedly use only half the input voltage range of the A/D converter assigned to each of the opposite polarities as in a conventionally required manner, and the entire input voltage range of the A/D converter can be used, so that twice the resolution of a conventional A/D converter can be obtained, and the original resolution of the A/D converter can be entirely used.

According to the present invention, when a battery voltage of each of battery blocks is stored in a capacitance section and then the battery voltage stored in the capacitance section is input to the level change section, each time the polarity of a voltage is inverted, the voltage input from the level change section to the A/D converter is caused to be in the input voltage range of the A/D converter, so that twice the resolution of a conventional A/D converter can be obtained, and an effect of the present invention such that the original resolution of the A/D converter can be entirely used can be attained.

According to the present invention, in order to switch a reference voltage for the level change section so as to obtain twice the resolution of the A/D converter, switching of the third switch section is controlled according to the polarity of the voltage input to the level change section or an output of the reference voltage generation section is controlled according to the polarity of the voltage input to the level change section, whereby a required structure can be simple.

According to the present invention, when the polarity of the voltage input to the level change section is previously known based on prestored table information for the switching control, the reference voltage control section controls the third switching section or the reference voltage generation section based on the table information for switching control, whereby the output of the reference voltage for the level change section can be readily controlled.

According to the present invention, in the case where the polarity of the voltage input to the level change section is previously unknown, when one reference voltage value is selected, if the reference voltage control section determines that an A/D conversion output of the A/D conversion section represents the maximum value or minimum value within the input voltage range of the A/D conversion section, the third switching section or the reference voltage generation section is controlled so as to switch the selected reference voltage value to the other reference voltage value, so that the reference voltage for the level change section can be readily controlled to be output in accordance with the polarity of the voltage input to the level change section.

According to the present invention, not only by causing the input voltage from the level change section to the A/D conversion section to be in the input voltage range of the A/D conversion section, but also by changing a gain of the level change section, the resolution of the A/D conversion section can be finer.

A battery voltage measurement device according to the present invention may include both of the battery pack 2 and the voltage measurement section 31 or may include only the voltage measurement section 31 without including the battery pack 2.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A battery voltage measurement device comprising:
   a plurality of first switching sections, wherein each pair of adjacent first switching sections sequentially selects two output terminals of each of a plurality of battery blocks included in a battery pack;
   a level change section for changing a level of a battery voltage of each battery block which is input to the level change section via the first switching section;
   an A/D conversion section for performing an A/D conversion of battery voltage data output from the level change section; and
   a reference voltage control section for controlling an output of a reference voltage of the level change section according to the polarity of the battery voltage input to the level change section.

2. A battery voltage measurement device according to claim 1, further comprising:
   a capacitance section for selectively storing a battery voltage of each of the battery blocks via the first switching section; and
   a second switching section for selectively applying the battery voltage stored in the capacitance section to the level change section, wherein the level change section changes a level of the battery voltage stored in the capacitance section which is input to the level change section via the second switching section.

3. A battery voltage measurement device according to claim 2, wherein the reference voltage control section includes:
   a third switching section for switching a reference voltage of the level change section; and
   a first switching control section for controlling the third switching section according to the polarity of the battery voltage input to the level change section.

4. A battery voltage measurement device according to claim 2, wherein the reference voltage control section includes:
   a reference voltage generation section for generating a reference voltage for the level change section; and
   a reference voltage generation control section for controlling an output of the reference voltage generation section according to the polarity of the battery voltage input to the level change section.

5. A battery voltage measurement device according to claim 4, further comprising:
   a fourth switching section for changing a feedback resistance value of the level change section so as to change a gain; and
   a second switching control section for controlling the fourth switching section according to the polarity of the battery voltage input to the level change section.

6. A battery voltage measurement device according to claim 1, wherein the reference voltage control section includes:
   a third switching section for switching a reference voltage of the level change section; and
   a first switching control section for controlling the third switching section according to the polarity of the battery voltage input to the level change section.

7. A battery voltage measurement device according to claim 1, wherein the reference voltage control section includes:
   a reference voltage generation section for generating a reference voltage for the level change section; and
   a reference voltage generation control section for controlling an output of the reference voltage generation section according to the polarity of the battery voltage input to the level change section.

8. A battery voltage measurement device according to claim 7, further comprising:
   a fourth switching section for changing a feedback resistance value of the level change section so as to change a gain; and
   a second switching control section for controlling the fourth switching section according to the polarity of the battery voltage input to the level change section.

9. A battery voltage measurement device according to claim 1, wherein the control performed in accordance wit the polarity of the battery voltage input to the level change section is performed based on prestored table information for switching control.

10. A battery voltage measurement device according to claim 1, wherein when one preset reference voltage value is selected, if an A/D conversion output of the A/D conversion section represents a maximum value or a minimum value within an input voltage range of the A/D conversion section, the control performed in accordance with the polarity of the battery voltage input to the level change section is performed so as to switch the one preset reference voltage value to the other preset reference voltage value.

11. A battery voltage measurement device comprising:
    a battery pack including a plurality of battery blocks;
    a plurality of first switching sections, wherein each pair of adjacent first switching sections sequentially selects two output terminals of each of the plurality of battery blocks;
    a level change section for changing a level of a battery voltage of each battery block which is input to the level change section via the first switching section;
    an A/D conversion section for performing an A/D conversion of battery voltage data output from the level change section; and
    a reference voltage control section for controlling an output of a reference voltage of the level change section according to the polarity of the battery voltage input to the level change section.

12. A battery voltage measurement device according to claim 11, further comprising:
    a capacitance section for selectively storing a battery voltage of each of the battery blocks via the first switching section; and
    a second switching section for selectively applying the battery voltage stored in the capacitance section to the level change section, wherein the level change section changes a level of the battery voltage stored in the capacitance section which is input to the level change section via the second switching section.

13. A battery voltage measurement device according to claim 12, wherein the reference voltage control section includes:
    a third switching section for switching a reference voltage of the level change section; and
    a first switching control section for controlling the third switching section according to the polarity of the battery voltage input to the level change section.

14. A battery voltage measurement device according to claim 12, wherein the reference voltage control section includes:

a reference voltage generation section for generating a reference voltage for the level change section; and a reference voltage generation control section for controlling an output of the reference voltage generation section according to the polarity of the battery voltage input to the level change section.

15. A battery voltage measurement device according to claim 14, further comprising:

a fourth switching section for changing a feedback resistance value of the level change section so as to change a gain; and a second switching control section for controlling the fourth switching section according to the polarity of the battery voltage input to the level change section.

16. A battery voltage measurement device according to claim 11, wherein the reference voltage control section includes:

a third switching section for switching a reference voltage of the level change section; and a first switching control section for controlling the third switching section according to the polarity of the battery voltage input to the level change section.

17. A battery voltage measurement device according to claim 11, wherein the reference voltage control section includes:

a reference voltage generation section for generating a reference voltage for the level change section; and a reference voltage generation control section for controlling an output of the reference voltage generation section according to the polarity of the battery voltage input to the level change section.

18. A battery voltage measurement device according to claim 17, further comprising:

a fourth switching section for changing a feedback resistance value of the level change section so as to change a gain; and a second switching control section for controlling the fourth switching section according to the polarity of the batten voltage input to the level change section.

19. A battery voltage measurement device according to claim 11, wherein the control performed in accordance with the polarity of the battery voltage input to the level change section is performed based on prestored table information for switching control.

20. A battery voltage measurement device according to claim 11, wherein when one preset reference voltage value is selected, if an A/D conversion output of the A/D conversion section represents a maximum value or a minimum value within an input voltage range of the A/D conversion section, the control performed in accordance with The polarity of the battery voltage input to the level change section is performed so as to switch the one preset reference voltage value to the other preset reference voltage value.

* * * * *